United States Patent
Spitz et al.

(10) Patent No.: US 9,660,550 B2
(45) Date of Patent: May 23, 2017

(54) GENERATOR DEVICE FOR THE VOLTAGE SUPPLY OF A MOTOR VEHICLE

(75) Inventors: Richard Spitz, Reutlingen (DE); Alfred Goerlach, Kusterdingen (DE); Carolin Tolksdorf, Groembach (DE); Dirk Ahlers, Munich (DE); Dietrich Bonart, Bad Abbach (DE)

(73) Assignees: Robert Bosch GmbH, Stuttgart (DE); Infineon Technologies AG, Neubiberg (DE)

( * ) Notice: Subject to any disclaimer, the term of this patent is extended or adjusted under 35 U.S.C. 154(b) by 75 days.

(21) Appl. No.: 13/990,334

(22) PCT Filed: Oct. 20, 2011

(86) PCT No.: PCT/EP2011/068298
§ 371 (c)(1),
(2), (4) Date: Aug. 26, 2013

(87) PCT Pub. No.: WO2012/076231
PCT Pub. Date: Jun. 14, 2012

(65) Prior Publication Data
US 2013/0329476 A1    Dec. 12, 2013

(30) Foreign Application Priority Data
Dec. 9, 2010  (DE) .................. 10 2010 062 677

(51) Int. Cl.
*H02M 7/217* (2006.01)
*H02M 7/219* (2006.01)
(Continued)

(52) U.S. Cl.
CPC .......... *H02M 7/219* (2013.01); *H01L 29/861* (2013.01); *H01L 29/1095* (2013.01);
(Continued)

(58) Field of Classification Search
CPC .......... H02M 7/02; H02M 7/21; H02M 7/217; H02M 7/219; H02M 2001/0051
(Continued)

(56) References Cited

U.S. PATENT DOCUMENTS 5,508,534 A * 4/1996 Nakamura ........ H01L 29/41716
257/135
5,744,994 A    4/1998 Williams
(Continued)

FOREIGN PATENT DOCUMENTS

CN    101065848 A    10/2007
CN    101897112 A    11/2010
(Continued)

OTHER PUBLICATIONS

International Search Report, dated Jun. 6, 2012, issued in corresponding PCT Application No. PCT/EP2011/068298.
(Continued)

*Primary Examiner* — Gary L Laxton
(74) *Attorney, Agent, or Firm* — Norton Rose Fulbright US LLP; Gerard A. Messina

(57) ABSTRACT

A generator device for the voltage supply of a motor vehicle is equipped with at least one rectifying element for rectifying an alternating voltage provided by a generator. The rectifying element has an n-channel MOS field-effect transistor in which the gate, the body area, and the source area are electrically fixedly connected to one another and in which the drain area is used as a cathode.

18 Claims, 1 Drawing Sheet

(51) Int. Cl.
*H01L 29/861* (2006.01)
*H01L 29/10* (2006.01)
*H01L 29/45* (2006.01)
*H01L 29/51* (2006.01)
*H01L 29/78* (2006.01)

(52) U.S. Cl.
CPC ............ *H01L 29/456* (2013.01); *H01L 29/51* (2013.01); *H01L 29/7802* (2013.01); *H01L 29/7813* (2013.01); *H01L 2924/0002* (2013.01)

(58) Field of Classification Search
USPC .............................. 363/85, 89, 125, 126, 127
See application file for complete search history.

(56) References Cited

U.S. PATENT DOCUMENTS

| | | | | |
|---|---|---|---|---|
| 5,818,084 | A * | 10/1998 | Williams | H01L 27/0727 257/146 |
| 6,252,381 | B1 * | 6/2001 | Schenk | 322/28 |
| 6,549,439 | B1 | 4/2003 | Yu | |
| 6,979,861 | B2 | 12/2005 | Rodov et al. | |
| 7,142,015 | B2 * | 11/2006 | Kuang | H03K 19/01721 326/27 |
| 7,221,127 | B2 * | 5/2007 | Masson | H02J 7/1461 322/100 |
| 8,531,226 | B2 * | 9/2013 | Montalbo et al. | 327/324 |
| 2003/0222290 | A1 | 12/2003 | Rodov et al. | |
| 2008/0158926 | A1 * | 7/2008 | Umeda et al. | 363/127 |
| 2010/0034000 | A1 * | 2/2010 | Battista | H01L 27/0811 363/127 |
| 2010/0078707 | A1 | 4/2010 | Haeberlen et al. | |
| 2010/0135053 | A1 * | 6/2010 | Morimoto | H02M 7/219 363/127 |
| 2013/0313948 | A1 * | 11/2013 | Zucker | H02K 11/0073 310/68 D |

FOREIGN PATENT DOCUMENTS

| | | |
|---|---|---|
| DE | 195 49 202 | 7/1997 |
| DE | 100 42 526 | 8/2001 |
| DE | 10042526 A1 | 8/2001 |
| DE | 10 2004 056 663 | 1/2006 |
| EP | 0807979 | 11/1997 |
| JP | 2000512805 | 9/2000 |
| JP | 2004153887 | 5/2004 |
| WO | 2007072226 A2 | 6/2007 |

OTHER PUBLICATIONS

XP011203330, Rodov et al., "Super Barrier Rectifier—A New Generation of Power Diode", IEEE Transactions on Industry Applications, vol. 44, No. 1, Jan. 1, 2008, pp. 234-237.

Kolar, et al. "Vienna Rectifier II—A Novel Single-Stage High-Frequency Isolated Three-Phase PWM Rectifier System", 1998 IEEE, Technical Univ. Vienna, pp. 23-33.

* cited by examiner

GENERATOR DEVICE FOR THE VOLTAGE SUPPLY OF A MOTOR VEHICLE

CROSS REFERENCE TO RELATED APPLICATIONS

The present application is the national stage entry of International Patent Application No. PCT/EP2011/068298, filed on Oct. 20, 2011, which claims priority to Application No. DE 10 2010 062 677.5, filed in the Federal Republic of Germany on Dec. 9, 2010.

FIELD OF INVENTION

The present invention relates to a generator device for the voltage supply of a motor vehicle.

BACKGROUND INFORMATION

Alternating current bridges (rectifiers) are used for rectification in three-phase or alternating current generators (alternators) of motor vehicles. Semiconductor diodes having a p-n junction made of silicon are used in most cases as rectifying elements. Six semiconductor diodes are, for example, interconnected in a three-phase generator to form a B6 bridge. Occasionally, diodes are also connected in parallel, for example, twelve diodes are used instead of six diodes. In alternating current generators having a different number of phases, accordingly adapted diode bridges are used. The diodes are configured for operation at high currents having current densities of more than 500 A/cm$^2$ and at high temperatures having a maximum junction temperature Tj of approximately 225° C. The voltage drop in the forward direction, forward voltage UF, is typically approximately 1 volt for the high currents used. In the case of operation in the reverse direction, only a very low reverse current IR up to a breakdown voltage UZ generally flows. Starting from this voltage, the reverse current increases very strongly. Another voltage rise is thus prevented.

In most cases, Zener diodes (Z diodes) having reverse voltages of approximately 20 volts to 40 volts are used in this context, depending on the electrical system voltage of the motor vehicle. At breakdown, Z diodes may briefly be subjected even to very high currents. They are therefore used for delimiting the overshooting generator voltage in the event of load changes (load dumps). Such diodes are usually packaged in robust press-in diode housings, as described in German Application No. DE 195 49 202 B4, for example.

One disadvantage of such a device is that the forward voltage of the p-n diodes results in conducting-state power losses and thus in an efficiency deterioration of the generator. Since two diodes are on average connected in series during a power output of the generator, the averaged conducting-state power losses in a 100-A generator are approximately 200 W. The associated heating of diodes and rectifiers must be reduced by complex cooling measures, e.g., by using heat sinks or fans.

German Application No. DE 10 2004 056 663 A1 proposes to use so-called high-efficiency diodes (HEDs) instead of the p-n diodes to reduce the conducting-state power losses. High-efficiency diodes (HEDs) are Schottky diodes which, in contrast to conventional Schottky diodes, do not have the barrier lowering effect (BL) caused by the reverse voltage and thus have low reverse currents. High-efficiency Schottky diodes (HEDs) include a combination—monolithically integrated on a semiconductor chip—of a conventional Schottky barrier diode (SBD) together with other elements such as magnetoresistors, p-n junctions, or different barrier metals. They are often implemented in trench technology.

With the aid of high-efficiency Schottky diodes (HED), essentially lower forward voltages UF may be implemented which are in the range of 0.5 V to 0.6 V. The low conducting-state power losses of the diodes increase the efficiency and the output power of the particular generator. Since Schottky diodes, as majority carrier components, switch very quickly, the radio interference suppression of the generator additionally improves in certain frequency ranges by up to 10 dB.

Due to the lower reverse power losses, the complexity for cooling the diodes may be additionally reduced compared to the use of p-n diodes.

A production of high-efficiency Schottky diodes (HEDs) is, however, complex and technically very sophisticated. In addition to the very fine trench structures, which have mesa widths in the range below 500 nm and must be etched into the silicon, a cost-effective production of suitable and stable Schottky contacts represents a challenge, in particular. Nickel silicides or other suitable silicides are preferably used as Schottky contacts. In modern semiconductor plants, in which power MOSFETs are produced, these silicide processes are usually not available.

SUMMARY

According to the present invention, it is proposed to use in rectifiers for motor vehicle generators specially produced n-channel MOSFETs in which the gate, the body area, and the source area are electrically fixedly connected to one another and in which the drain area is used as a cathode. Similarly to the HEDs, low forward voltages, which are lower than the forward voltage of a p-n diode, maybe achieved with the aid of these special rectifying elements, which are also referred to as Pseudo-Schottky diodes (PSD). Such a rectifying element preferably has a conducting-state voltage which is lower than 0.7 V when a current flows through it at 500 A/cm$^2$. Preferably, this conducting-state voltage is between 0.5 V and 0.7 V. Such rectifying elements do not include any Schottky contacts and therefore do not need special silicide processes either. They may be produced in both planar and trench technology using slightly modified standard processes for MOSFETs. Being majority carrier components, they again switch very quickly.

DETAILED DESCRIPTION

Figure 1:
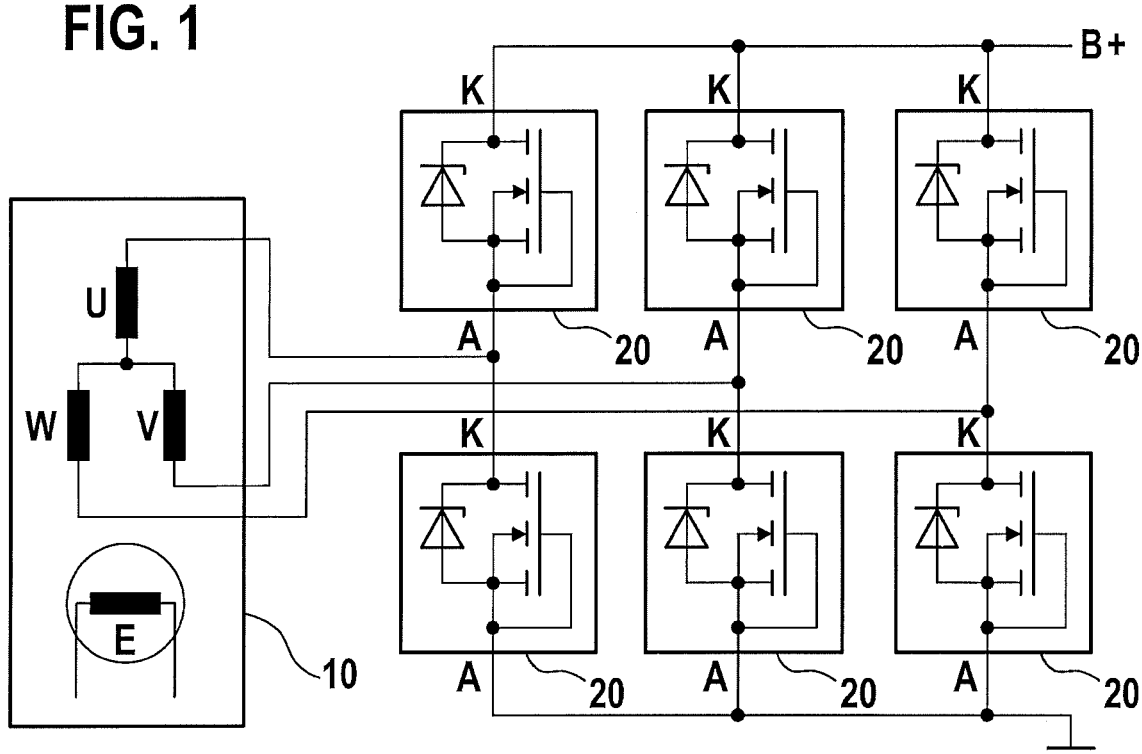
FIG. 1 shows an exemplary embodiment of a generator device according to the present invention.

One exemplary embodiment of a generator device according to the present invention is illustrated in FIG. 1. Here, reference numeral 10 denotes a three-phase generator operated in a star to connection having phases or windings U, V, and W and rotatable field winding E. A claw-pole generator which is customary in motor vehicles may, for example, be used as the generator. Other generators and generators having more than three phases may of course also be used. Another electrical interconnection within the generator, e.g., a star connection, is also possible. Reference numerals 20 each denote as rectifying components a Pseudo-Schottky diode implemented with the aid of a self-locking n-channel MOSFET. In this case, self-locking n-channel MOSFETs 20 are connected in such a way that the gate, the body area, and the source area are electrically fixedly connected to one another and that the drain area is used as a cathode. This interconnection may basically take place discretely, but it is particularly advantageously monolithically implemented in the MOSFET which is used as a Pseudo-Schottky. In this way, a bipolar configuration is obtained which has an anode connection A and a cathode connection K plotted in FIG. 1.

If, in contrast to anode A, a positive voltage is applied to cathode connection K, the MOSFET locks, since its gate is on source potential. The current flow is stopped except for a minor reverse current. In this configuration, the MOSFET may even be used as a Z diode. This makes it possible to delimit overvoltages in the case of error, e.g., when the voltage rises due to a sudden load dump. If the voltage exceeds breakdown voltage UZ of the body diode, the diode breaks (avalanche breakdown) and thus prevents a further voltage rise.

If the voltage polarity is reversed, the transistor is operated in the 3rd quadrant. After overcoming a threshold voltage, the current flows since the integrated diode, the so-called body diode, is polarized in the forward direction. Forward voltage UF drops at the diode. In contrast to a system in which the gate is interconnected with the drain connection of the MOSFET, the gate is now electrically connected to the source contact. In this case, conducting-state voltage UON is slightly lower than forward voltage UF. In customary MOSFETs, the difference between these two voltages is, however, very minor. In a 60-V power MOSFET having a threshold voltage UTH of approximately 1.8 V, the difference is in the range of 20 mV, measured in the mA range. In Pseudo-Schottky diodes, additional component-specific properties of the MOSFETs must therefore be changed in a suitable manner compared to conventional transistors.

In principle, the configuration of a Pseudo-Schottky diode (PSD) is largely identical to the configuration of a conventional power MOSFET, as described in the textbook Halbleiter-Leistungsbauelemente by J. Lutz, Springer Verlag 2006. In contrast to a conventional MOSFET, the gate connection is, however, usually not separate, but is directly connected to the source area. However, other changes remain to be carried out on the MOSFET, which is used as the PSD, so that a low conducting-state voltage UON occurs.

This is explained in the following:

One functionality when operating in the 3rd quadrant of the MOSFET, the forward direction of the PSD, may also be seen as operating a MOSFET in the 1st quadrant with source and drain connections S and D being reversed. In this case, source area S becomes drain connection D' and drain area D becomes source connection S'. This change of names makes an operation in the 3rd quadrant an operation in the 1st quadrant using the usual identification. P-doped body area B, highly n-doped drain area D' (former source area S), and gate G are then on drain potential UD'. In this case, the voltage between D' and S' cannot, however, exceed diode forward voltage UF. Based on these observations, it is detected that due to UD'S'=UGS', the transistor is always operated at saturation, and due to UD'S'=UBS'>0, the p-doped body area is positively biased with regard to S'. A positive voltage at the body area, however, reduces threshold voltage UTH of a MOSFET. The space charge reduced at the body area due to the positive potential is offset by a higher inversion charge.

To obtain a conducting-state voltage UON comparable to an HED, a MOSFET which is suitable as a PSD must have a very low threshold voltage UTH as well as a noteworthy reduction due to the body effect. These two requirements are basically contradictory. For achieving a great body effect, it is thus favorable to select the gate oxide thickness and the body doping to be as high as possible. The body doping is, however, already determined by the selected reverse voltage. This, in turn, is contradictory to the requirement for a low threshold voltage UTH. For this reason, the threshold voltage must be adjusted independently of the body effect with the aid of an additional measure. This may take place with the aid of a threshold implant using donors, for example. In this way, the p-doping on the surface of the body area is reduced and therefore so is threshold voltage UTH. With the aid of these measures, Pseudo-Schottky diodes are obtained which have HED comparable forward voltages and additionally act as Z diodes.

Figure 2:
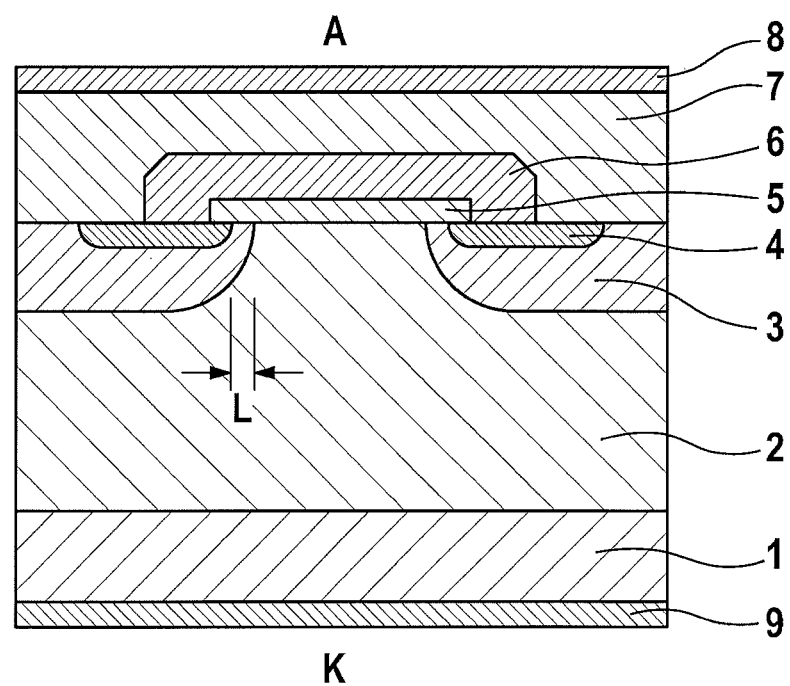
FIG. 2 shows an example of a design of a Pseudo-Schottky diode (PSD) in cross section.

FIG. 2 illustrates an example of a design of a Pseudo-Schottky diode (PSD) in cross section. Here, only one cell is sectionally viewed. An n-doped layer 2, into which p-doped layers 3, the body areas, are introduced, is located on a highly n+-doped semiconductor 1. Thin, very highly n+-doped areas 4, source areas S, which are spaced at a certain distance, namely channel length L, from the edge of body areas 3, are located within body areas 3. A dielectric layer 5, which is, for example, made of silicon dioxide having a thickness tox in the range of approximately 50 nm to 200 nm and which overlaps n-doped areas 2 between body areas 3, body areas 3 in the area of channel L, and partially also source areas 4, is located on the semiconductor surface. Dielectric layer 5 is covered by a highly doped polysilicon layer 6, the gate electrode.

The structure therefore corresponds to a conventional planar DMOS structure.

In contrast to a conventional planar DMOS structure, the gate electrode is, in this case, not electrically insulated from source and body areas 4 and 3, but is electrically connected to them. Above polysilicon layer 6 and source and body areas 4 and 3, which are not covered by same, there is a metal layer 7 which electrically connects the three areas to one another. Source area 4 is in addition also directly connected to area 6. This is, however, not absolutely necessary since the connection is also present through metal layer 7. Metal layer 7 is preferably made of AlSiCu or AlCu, or copper. Above metal layer 7 and below substrate 1, there are metal layer systems 8 and 9 which ensure the ohmic connection of substrate 1 and in addition form a solderable front side 8 and a back side 9. The metal layer system may, for example, be Ti/NiV/Ag. The component has only two connections: anode connection A (area 8) and cathode connection K (area 9). To reduce the threshold voltage, p-doped body areas 3 of a PSD are doped less highly on their surfaces, at least in the channel area. This area is not indicated in FIG. 2 for the sake of clarity.

Another exemplary embodiment for the present invention is now explained again based on FIG. 1. Reference numerals and functions are identical to those of the exemplary embodiment described above. Here, too, each of the rectifying elements is a MOSFET which has short-circuited gate, source and body areas and is operated in the 3rd quadrant. Once again, this may be regarded as an operation at saturation in the 1st quadrant with source and drain connections S' and D' being reversed. In contrast to the previously described exemplary embodiment, the positive influence of the body effect is largely dispensed with in this case. Threshold voltage UTH is, however, selected to be essentially even lower than in the previously described exemplary embodiment. Low threshold voltages UTH are preferably achieved by using very thin gate oxides, which preferably have thicknesses smaller than 20 nm, e.g., 10 nm, and additionally by carrying out again a threshold implant of p-doped basis 6 using donors. Instead of the usual SiO2 gate oxides, dielectric materials having a higher dielectric constant, e.g., HfO2, ZrO2, Si3N4, etc., the so-called high K materials, may be used. Such materials are described in U.S. Patent Application Publication No. 2010/0078707, for example.

If in the "load dump case" the voltage limitation by the PSDs is not sufficient in itself, conventional Z diodes may also be switched in parallel to the PSDs in the rectifier. In this case, the breakdown voltage of the PSD must be selected to be greater than that of the Z diodes. The PSDs in the forward direction then take over the current, while the breakdown takes place exclusively in the additional Z diodes.

Furthermore, structures may be used in the PSDs which additionally have another integrated p-n junction, for example, which determines the breakdown voltage.

Furthermore, circuits may be used in which only the plus diodes or alternatively thereto only the minus diodes are replaced by PSDs in each case.

What is claimed is:

1. A generator device for voltage supply of a motor vehicle, comprising:
   at least one rectifying element for rectifying an alternating voltage provided by a generator;
   wherein the rectifying element has an n-channel MOS field-effect transistor in which a gate, a body area, and a source area are electrically fixedly connected to one another at a same node and in which the drain area is used as a cathode; the rectifying element has a conducting-state voltage which is lower than a forward voltage of a p-n diode; the rectifying element has the conducting-state voltage (UON) which is lower than 0.7 V when a current flows through the rectifying element at 500 A/cm2; and the rectifying element has a gate oxide thickness which is smaller than 20 nm.

2. The generator device as recited in claim 1, wherein a doping of the body area is reduced to reduce a threshold voltage on a surface.

3. The generator device as recited in claim 1, wherein a connection of source and gate contacts is monolithically integrated.

4. The generator device as recited in claim 1, wherein the rectifying element has solderable front and back sides.

5. The generator device as recited in claim 1, wherein the rectifying element has an integrated voltage limitation (load dump protection).

6. The generator device as recited in claim 5, wherein the integrated voltage limitation takes place due to an avalanche breakdown of a body diode.

7. The generator device as recited in claim 1, wherein the MOSFET is produced as a power MOSFET in planar technology or as a power MOSFET in trench technology.

8. The generator device as recited in claim 1, wherein the generator device has multiple rectifying elements, each rectifying element being integrated into a bipolar press-in diode housing.

9. The generator device as recited in claim 1, wherein elements for voltage limitation are connected in parallel to the rectifying elements.

10. The generator device as recited in claim 1, wherein the generator device includes at least three windings and at least one rotable field winding.

11. The generator device as recited in claim 1, wherein the generator device is a claw-pole generator.

12. The generator device as recited in claim 1, further comprising:
   at least two rectifying elements;
   wherein the generator device includes at least one winding,
   wherein an anode of a first one of the at least two rectifying elements is connected at a connection point to a cathode of a second one of the at least two rectifying elements, and
   wherein the connection point is further connected to the at least one winding.

13. The generator device as recited in claim 12, further comprising:
   at least six rectifying elements;
   wherein the generator device includes at least three windings,
   wherein the at least six rectifying elements include three pairs of rectifying elements, and
   wherein for each of the three pairs included in the at least six rectifying elements: an anode of a first one of the pair is connected at a connection point to a cathode of a second one of the pair, and the connection point is further connected to one of the at least three windings.

14. A generator device for voltage supply of a motor vehicle, comprising:
   at least one rectifying element for rectifying an alternating voltage provided by a generator;
   wherein the rectifying element has an n-channel MOS field-effect transistor in which a gate, a body area, and a source area are electrically fixedly connected to one another at a same node and in which the drain area is used as a cathode, and
   wherein the rectifying element has a conducting-state voltage (UON) which is: (i) lower than a forward voltage of a p-n diode, and (ii) lower than 0.7 V when a current flows through the rectifying element at 500 A/cm2.

15. The generator device as recited in claim 14, wherein the rectifying element has the conducting-state voltage which is lower than the forward voltage of the p-n diode.

16. The generator device as recited in claim 14, wherein the rectifying element has the conducting-state voltage (UON) which is lower than 0.7 V when the current flows through the rectifying element at 500 A/cm2.

17. The generator device as recited in claim 14, wherein the rectifying element has a gate oxide thickness which is smaller than 20 nm.

18. The generator device as recited in claim 14, wherein a doping of the body area is reduced to reduce a threshold voltage on a surface.

* * * * *